VARIABLE DELAY SYSTEM

Filed Dec. 21, 1954

United States Patent Office 2,824,227

Patented Feb. 18, 1958

2,824,227

VARIABLE DELAY SYSTEM

Donald Richman, Fresh Meadows, N. Y., assignor to Hazeltine Research, Inc., Chicago, Ill., a corporation of Illinois Application December 21, 1954, Serial No. 476,637

15 Claims. (Cl. 250—27)

*General*

This invention relates to variable delay systems and, particularly, to such systems for imparting an adjustable time delay to electrical signals translated thereby.

For many applications it would be desirable to have a delay system for varying the time delay of an electrical input signal in accordance with an electrical control signal so as to be able to rearrange the time sequence of information contained in the input signal in any desired manner. For one thing, such a system could be utilized to enable transmission of an increased amount of information over a channel of limited band width.

Previously proposed delay lines of fixed length, of course, offer no solution to the problem. The use of a tapped delay line and a plurality of mechanical switches for switching between the various taps to determine the length of delay line over which the different portions of the signal information are to be translated is also inadequate for many applications because the delay increments are not continuously variable, the switching action is too slow, or the apparatus is more cumbersome and complex than is desirable. The use of electronic switches, such as beam-deflection switching tubes, in place of the mechanical switches is also undesirable because of increased circuit complexity necessitated thereby and the high power required for rapid switching.

It is an object of the invention, therefore, to provide a new and improved variable delay system which substantially avoids one or more of the foregoing limitations of delay systems heretofore proposed.

It is another object of the invention to provide a new and improved variable delay system for varying the time delay of an electrical input signal in accordance with an electrical control signal.

In accordance with the invention a variable delay system for varying the time delay of an input signal in accordance with a control signal comprises circuit means for encoding the input signal as modulation of a carrier signal. The system also includes circuit means responsive to the control signal for determining the instantaneous frequency of the carrier signal. The system additionally includes circuit means responsive to the modulated carrier signal for producing an output signal having a time delay determined by the instantaneous frequency of the carrier signal.

For a better understanding of the present invention, together with other and further objects thereof, reference is had to the following description taken in connection with the accompanying drawings, and its scope will be pointed out in the appended claims.

Referring to the drawings.

Figure 1:
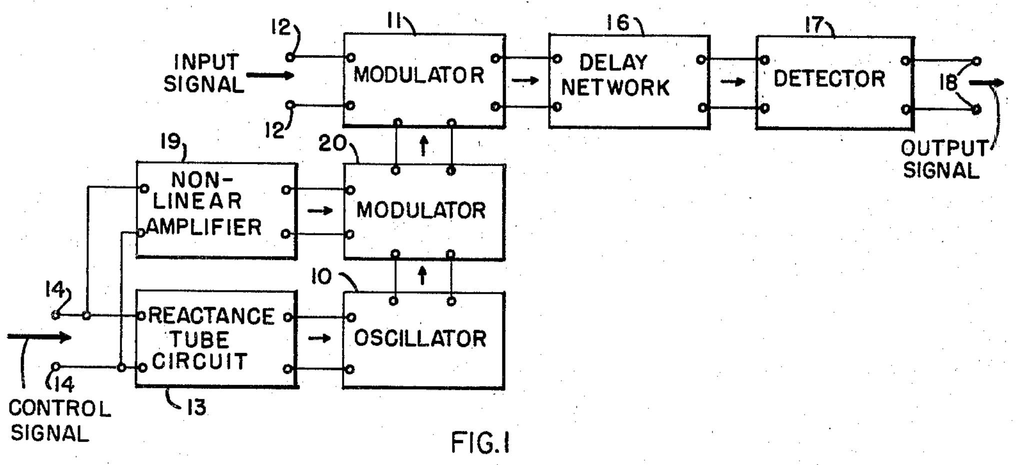
Fig. 1 is a circuit diagram of a variable delay system constructed in accordance with the present invention.

*Description of Fig. 1 variable delay system*

Referring now to Fig. 1 of the drawings, there is represented a variable delay system constructed in accordance with the present invention for varying the time delay of an input signal in accordance with a control signal and comprising circuit means for encoding the input signal as modulation of a carrier signal. This circuit means may include, for example, oscillator circuit means 10, of conventional construction, for supplying a carrier signal and modulator circuit means 11, also of conventional construction, coupled to the oscillator 10 and to a pair of input signal terminals 12, 12 for encoding the input signal as amplitude modulation of the carrier signal.

The variable delay system also includes circuit means responsive to the control signal for determining the instantaneous frequency of the carrier signal. This circuit means may include, for example, a reactance tube circuit 13, of conventional construction, coupled between the oscillator 10 and a pair of terminals 14, 14 and responsive to the control signal supplied thereto by way of terminals 14, 14 for determining the instantaneous frequency of the carrier signal over a predetermined frequency range.

The variable delay system also includes circuit means, including a time-delay network 16, responsive to the modulated carrier signal for producing an output signal having a time delay determined by the instantaneous frequency of the carrier signal. The delay network 16 may be, for example, a band-pass type of filter network having a substantially square-law phase-shift characteristic over the predetermined frequency range.

The last-mentioned means for producing an output signal may also include an amplitude detector 17, of conventional construction, coupled to the output terminals of the delay network 16 for detecting the modulation of the delayed carrier signal to produce at a pair of output terminals 18, 18 an output signal the individual portions of which have the desired time delay with respect to the corresponding portions of the input signal.

For some purposes the variable delay system may additionally include circuit means coupled to the encoding circuit means and responsive to the control signal for adjusting the amplitude of the carrier signal to minimize undesirable amplitude variations occurring in the output signal. Such circuit means may include, for example, a nonlinear amplifier 19, of conventional construction, coupled to the control signal terminals 14, 14 and responsive to the control signal for developing a compensation signal. This circuit means may additionally include a second modulator 20 coupled between the oscillator 10 and the first-mentioned modulator 11 and responsive to the compensation signal supplied by the nonlinear amplifier 19 for adjusting the amplitude of the carrier signal to minimize undesirable amplitude variations occurring in the output signal.

The units 10, 11, 13, 16, 17, 19, and 20, taken individually and without reference to their function in the present system, may be of conventional construction and operation so that a detailed description and explanation of the operation thereof are unnecessary herein.

*Operation of Fig. 1 variable delay system*

Considering the operation of the variable delay system just described, a variable time delay is obtained by encoding the input signal as modulation of a carrier signal and then supplying the modulated carrier signal to a requency-sensitive delay network 16 for imparting thereto a time delay which is dependent on the carrier frequency. To be more precise, the oscillator 10 generates a carrier signal which is supplied through the modulator 20 to the modulator 11, the purpose of modulator 20 being ignored for the present. The input signal to be delayed is also supplied to the modulator 11 by way of terminals 12, 12 and is encoded by the modulator 11 as amplitude modulation of the carrier signal supplied thereto by the oscillator 10. The modulated carrier signal is then supplied to the delay network 16 which has a frequency versus time-delay characteristic as indicated by curve A of Fig. 2 and is thus able to impart to the modulated signal a time delay dependent on the frequency of the carrier signal. The delayed carrier signal is then supplied to a detector 17 wherein the delayed modulation is recovered from the carrier signal and supplied to the output signal terminals 18, 18.

To control the carrier frequency and, hence, the time delay furnished by network 16, the reactance tube 13 is coupled to the oscillator 10 in a conventional manner. In response to the control signal supplied to the reactance tube circuit 13, that circuit is effective to vary the operating frequency of the oscillator 10 in a conventional manner. As a result, the time delay of the various portions of the input signal may be varied in any desired manner simply by applying an appropriate control signal to the reactance tube circuit 13.

Figure 2:
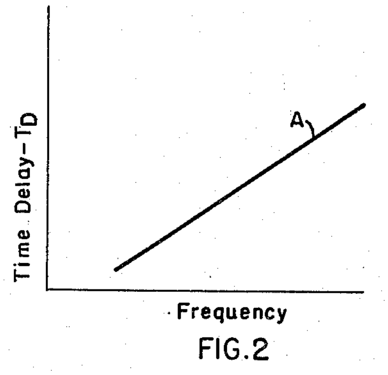
Fig. 2 is a frequency versus time-delay curve for a delay network of the Fig. 1 system.
Figure 3:
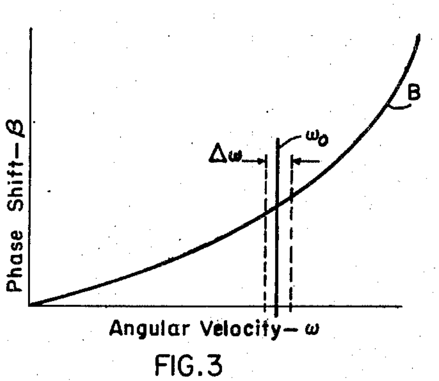
Fig. 3 is a phase-shift characteristic curve for the same delay network of the Fig. 1 system.

In order to have a linear frequency versus time-delay characteristic as indicated by curve A of Fig. 2, the delay network 16 should have a square-law type of phase-shift characteristic as indicated by curve B of Fig. 3. In any narrow band of frequencies such as represented by $\Delta\omega$ of Fig. 3 centered about a carrier frequency, expressed in terms of angular velocity, of $\omega_0$, the curve may be considered as being substantially linear and, hence, the time delay imparted to that carrier frequency and its modulation components corresponds to the slope of the curve.

In other words:

$$T_d=\frac{d\beta}{d\omega} \qquad (1)$$

where $T_d$=time delay in seconds
$\beta$=phase shift in radians
$\omega$=angular velocity difference in radians per second=$2\pi f$
(where $f$=carrier frequency—any reference frequency)

Assuming a square-law characteristic for curve B of Fig. 3 gives $$\beta=k\omega^2+C \qquad (2)$$

where $k$=*a* proportionality constant and $C$=*a* constant. Hence, $$\frac{d\beta}{d\omega}=2k\omega=k'f \qquad (3)$$

where $k'$=another proportionality constant. Substituting Equation 3 into Equation 1 gives $$T_d=k'f \qquad (4)$$

which indicates that for a square-law phase-shift characteristic, the time delay of the network is proportional to the frequency of the carrier signal being translated by the network. One type of network displaying such a square-law phase-shift characteristic over a sufficiently extended frequency range is a low-pass filter network composed of a number of cascaded low-pass filter sections. The primary limitation to such a filter network is that the amplitude versus frequency response of the network may not be uniform over the entire frequency range where large delay variations are desired. Such nonuniformity leads to undesirable amplitude variations in the output signal. This limitation, however, disappears when some form of distortion correction is utilized.

Means for eliminating undesirable variations in the amplitude of the output signal is represented by the nonlinear amplifier 19 and modulator 20 of Fig. 1. For distortion caused by nonuniformity in the amplitude response of the delay network 16, correction is obtained because each voltage level of the control signal corresponds to a given carrier frequency and in this manner a compensation signal may be developed by the nonlinear amplier 19 for controlling the modulator 20 and, hence, the amplitude of the carrier signal translated therethrough in accordance with the particular frequency of the carrier signal being generated. In this manner, for example in one particular filter network, as the carrier frequency increases, a decrease in the amplitude of the signal supplied by the delay network 16 to the detector 17 due to the nonuniform amplitude characteristic of the network 16 is compensated for by an increase in the amplitude of the carrier signal as it passes through the modulator 20. In other words, variations in the amplitude of the modulated carrier signal caused by the nonuniform amplitude response of the delay network 16 are effectively canceled by inverse variations in the amplitude of the carrier signal as it passes through the modulator 20. This type of distortion correction may also be utilized to compensate for other types of undesirable amplitude variations in the output signal such as, for example, undesirable variations that may occur when the carrier frequency is varied at a rapid rate with respect to the modulation band width.

In operation, a source of signals conveying desired information may be coupled to the input terminals 12, 12 of the variable delay ssytem. The variable delay system is then utilized for rearranging the time sequence of the discrete elements of the input signal in a desired manner. The rearranged signal is then supplied by way of the output terminals 18, 18 to a utilization device coupled thereto.

Figure 4:
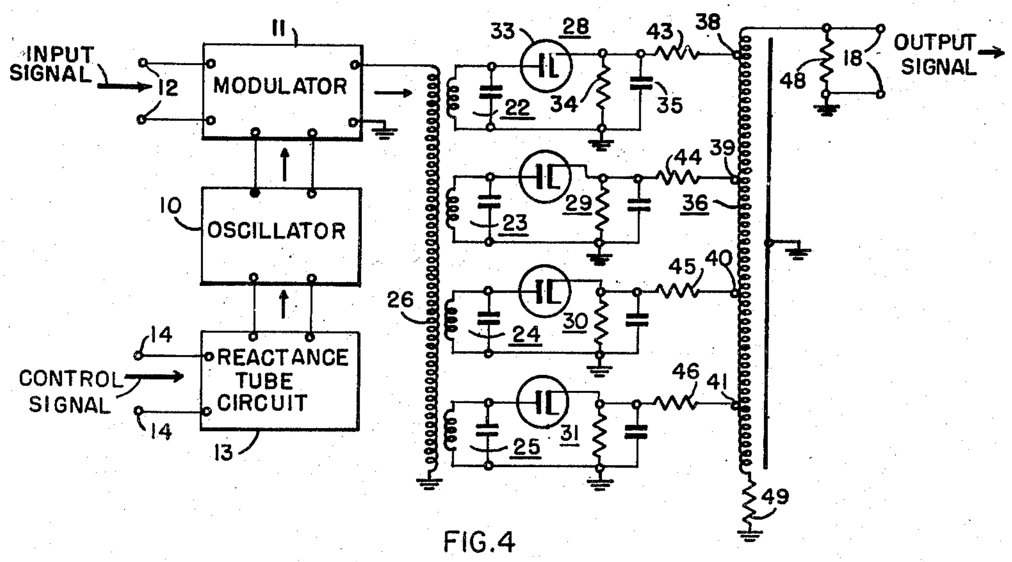
Fig. 4 is a circuit diagram partly schematic of a further embodiment of the invention.

*Description of Fig. 4 variable delay system*

Referring now to Fig. 4 of the drawings, there is represented another embodiment of the present invention. In addition to the oscillator 10, modulator 11, and reactance tube circuit 13 which also appear in the Fig. 1 embodiment and, hence, are indicated by the same reference numerals in the Fig. 4 embodiment, the variable delay system of Fig. 4 comprises a plurality of resonant circuits, for example, resonant circuits 22, 23, 24, and 25 individually resonant at different possible carrier frequencies for selectively translating portions of the modulated carrier signal in accordance with the instantaneous carrier frequency thereof. Each of the resonant circuits may be electromagnetically coupled through a primary transformer winding 26 to the output terminals of the modulator 11.

The variable delay system also includes circuit means responsive to the selected portions of the modulated carrier signal for producing a resultant output signal, the individual portions thereof having a time delay determined by the resonant circuit through which the corresponding selected portion of the modulated carrier signal was translated. This circuit means may include, for example, a plurality of detector circuit means 28, 29, 30, and 31 individually coupled to the resonant circuits 22, 23, 24, and 25 for detecting the modulation of the carrier signal portion translated thereby. The detector circuit means 28 may include, for example, a diode 33, a load resistor 34, and a carrier-frequency by-pass condenser 35, and the other detector circuit means may include similar elements.

The circuit means for producing an output signal further includes a delay network 36 having a plurality of spaced terminals represented by terminals 38, 39, 40, and 41 individually coupled through corresponding coupling resistors 43, 44, 45, and 46 to the corresponding detector circuits 28, 29, 30, and 31 for imparting to the detected portions of the modulation signal a time delay determined by the resonant circuit through which the corresponding selected portion of the modulated carrier signal was translated.

The circuit means for producing an output signal also includes an output circuit for combining the delayed portions of the modulation signal to produce an output signal. The combining circuit includes, for example, a load resistor 48 and output terminals 18, 18 coupled to one end of the delay network 36. The other end of the delay network 36 is preferably terminated by an impedance-matching resistor 49.

In some cases it may be desirable to reduce the physical size and complexity of the network 36 by utilizing a delay line of relatively narrow band width. In such a case, the resonant circuits represented by 22–25, inclusive, should be designed to have relatively narrow pass bands, which can be spaced close to one another. Pulse-shape distortion due to the narrowness of the pass band may be eliminated by including a suitable pulse-shaping network in the last-mentioned output circuit.

Also, if desirable, the distortion correction units represented by the nonlinear amplifier 19 and the modulator 20 may also be used in the Fig. 4 system by coupling these units to the other units of the Fig. 4 system in the same manner as is shown in Fig. 1. Also, to eliminate the number of detector circuits required, the various detector circuits 28–31, inclusive, may be omitted and the various resonant circuits 22–25, inclusive, directly coupled to the corresponding coupling resistors 43–46, inclusive, while only a single detector circuit such as unit 28 is used in place of the load resistor 48.

*Operation of Fig. 4 variable delay system*

Considering the operation of the Fig. 4 embodiment just described, the operation of the oscillator 10, modulator 11, and reactance tube 13 is the same as that of the corresponding units of the Fig. 1 system, namely, that the oscillator 10 generates a carrier signal upon which the input signal is encoded as modulation thereof by the modulator 11, the frequency of the carrier signal being determined by the voltage of the control signal supplied to the reactance tube circuit 13. The modulated carrier signal is then supplied by the modulator 11 to the primary transformer winding 26 which is electromagnetically coupled to the various resonant circuits 22–25, inclusive. As each of these resonant circuits is resonant at a different carrier frequency, only that portion of the modulated carrier signal having a carrier frequency corresponding to the resonant frequency thereof is translated by the corresponding resonant circuit. In this manner, a portion of the input signal having one carrier frequency is translated by the network 22 to the detector circuit 28, while another portion of the input signal having a different carrier frequency is translated by the resonant circuit 23 to the detector circuit 29, and so on for the remaining resonant circuits, the detector circuits being effective to recover the various portions of the modulation signal from the corresponding portions of the carrier signal. In this manner, one portion of the modulation signal is supplied to the first terminal 38 of the delay network 36 while another portion is supplied to the terminal 39 and so on for the remainder of the terminals.

All of the various portions of the modulation signal are supplied by the delay network 36 to the load resistor 48. The time of occurrence of these various modulation signal portions across the load resistor 48, however, does not correspond to their occurrence in the input signal because each portion must traverse a different length of the delay network 36 to reach the load resistor 48. In this manner, a resultant output signal is produced across the load resistor 48 of which the various portions are delayed in time with respect to the corresponding portions of the input signal by an amount determined by the resonant circuit through which each portion was translated and, hence, the length of delay network 36 traversed thereby.

Of course, the number of resonant circuits, detector circuits, and delay network 36 terminals shown in Fig. 4 are representative only and any number of such components may be utilized. The more resonant circuit selective channels that are utilized, the less likelihood there is for undesirable distortion to occur due to the finite number thereof. This type of distortion and, hence, the number of selective channels required is, of course, dependent on the nature of the input signal being utilized and the type of delay variation desired. In any event, where it is not convenient to utilize an optimum number of selective channels, distortion correction may be utilized to permit utilization of a lesser number of selective channels.

From the foregoing description of the various embodiments of the invention, it will be apparent that a variable delay system, constructed in accordance with the present invention, represents a new and novel system for varying the time delay of different portions of an input signal in any desired manner by means of an electrical control signal.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A variable delay system for varying the time delay of an input signal in accordance with a control signal, the system comprising: circuit means for encoding the input signal as modulation of a carrier signal; circuit means responsive to the control signal for determining the instantaneous frequency of the carrier signal; and circuit means responsive to the modulated carrier signal for producing an output signal having a time delay determined by the instantaneous frequency of the carrier signal.

2. A variable delay system for varying the time delay of an input signal having a plurality of discrete elements in accordance with a control signal, the system comprising: circuit means for encoding the input signal as modulation of a carrier signal; circuit means responsive to the control signal for determining the instantaneous frequency of the carrier signal; and circuit means responsive to the instantaneous frequency of the modulated carrier signal for rearranging the time sequence of the discrete elements of the input signal.

3. A variable delay system for varying the time delay of an input signal in accordance with a control signal, the system comprising: oscillator circuit means for supplying a carrier signal; modulator circuit means for encoding the input signal as modulation of the carrier signal; circuit means responsive to the control signal for determining the instantaneous frequency of the carrier signal; and circuit means responsive to the modulated carrier signal for producing an output signal having a time delay determined by the instantaneous frequency of the carrier signal.

4. A variable delay system for varying the time delay of an input signal in accordance with a control signal, the system comprising: circuit means for encoding the input signal as amplitude modulation of a carrier signal; circuit means responsive to the control signal for determining the instantaneous frequency of the carrier signal; and circuit means responsive to the modulated carrier signal for producing an output signal having a time delay determined by the instantaneous frequency of the carrier signal.

5. A variable delay system for varying the time delay of an input signal in accordance with a control signal, the system comprising: circuit means for encoding the input signal as modulation of a carrier signal; a reactance tube circuit responsive to the control signal for determining the instantaneous frequency of the carrier signal; and circuit means responsive to the modulated carrier signal for producing an output signal having a time delay determined by the instantaneous frequency of the carrier signal.

6. A variable delay system for varying the time delay of an input signal in accordance with a control signal, the system comprising: circuit means for encoding the input signal as modulation of a carrier signal; circuit means responsive to the control signal for determining the instantaneous frequency of the carrier signal; and circuit means, including a time-delay network, responsive to the modulated carrier signal for producing an output signal having a time delay determined by the instantaneous frequency of the carrier signal.

7. A variable delay system for varying the time delay of an input signal in accordance with a control signal, the system comprising: circuit means for encoding the input signal as modulation of a carrier signal; circuit means responsive to the control signal for determining the instantaneous frequency of the carrier signal; circuit means responsive to the modulated carrier signal for producing an output signal having a time delay determined by the instantaneous frequency of the carrier signal; and circuit means coupled to the encoding circuit means and responsive to the control signal for adjusting the amplitude of the carrier signal to minimize undesirable amplitude variations occurring in the output signal.

8. A variable delay system for varying the time delay of an input signal in accordance with a control signal, the system comprising: oscillator circuit means for supplying a carrier sginal; first modulator circuit means for encoding the input signal as modulation of the carrier signal; circuit means responsive to the control signal for determining the instantaneous frequency of the carrier signal; circuit means responsive to the modulated carrier signal for producing an output signal having a time delay determined by the instantaneous frequency of the carrier signal; circuit means responsive to the control signal for developing a compensation signal; and second modulator circuit means coupled between the oscillator circuit means and the first modulator circuit means and responsive to the compensation signal for adjusting the amplitude of the carrier signal to minimize undesirable amplitude variations occurring in the output signal.

9. A variable delay system for varying the time delay of an input signal in accordance with a control signal, the system comprising: circuit means for encoding the input signal as modulation of a carrier signal; circuit means responsive to the control signal for determining the instantaneous frequency of the carrier signal; circuit means for delaying the modulated carrier signal by an amount determined by the frequency of the carrier signal; and circuit means for detecting the modulation of the delayed carrier signal to produce an output signal the individual portions thereof having the desired time delay with respect to the corresponding portions of the input signal.

10. A variable delay system for varying the time delay of an input signal in accordance with a control signal, the system comprising: circuit means for encoding the input signal as modulation of a carrier signal; circuit means responsive to the control signal for determining the instantaneous frequency of the carrier signal; circuit means having a square-law phase-shift characteristic for delaying the modulated carrier signal by an amount determined by the frequency of the carrier signal; and circuit means for detecting the modulation of the delayed carrier signal to produce an output signal the individual portions thereof having the desired time delay with respect to the corresponding portions of the input signal.

11. A variable delay system for varying the time delay of an input signal in accordance with a control signal, the system comprising: circuit means for encoding the input signal as modulation of a carrier signal; circuit means responsive to the control signal for determining the instantaneous frequency of the carrier signal over a predetermined frequency range; a low-pass filter network having a substantially square-law phase-shift characteristic over the predetermined frequency range for delaying the modulated carrier signal by an amount determined by the frequency of the carrier signal; and circuit means for detecting the modulation of the delayed carrier signal to produce an output signal the individual portions thereof having the desired time delay with respect to the corresponding portions of the input signal.

12. A variable delay system for varying the time delay of an input signal in accordance with a control signal, the system comprising: circuit means for encoding the input signal as modulation of a carrier signal; circuit means responsive to the control signal for determining the instantaneous frequency of the carrier signal; circuit means for delaying the modulated carrier signal by an amount determined by the frequency of the carrier signal; and an amplitude detector for detecting the modulation of the delayed carrier signal to produce an output signal the individual portions thereof having the desired time delay with respect to the corresponding portions of the input signal.

13. A variable delay system for varying the time delay of an input signal in accordance with a control signal, the system comprising: circuit means for encoding the input signal as modulation of a carrier signal; circuit means responsive to the control signal for determining the instantaneous frequency of the carrier signal; a plurality of resonant circuits individually resonant at different possible carrier frequencies for selectively translating portions of said modulated carrier signal in accordance with the instantaneous carrier frequencies thereof; and circuit means responsive to the selected portions of the modulated carrier signal for producing a resultant output signal the individual portions thereof having a time delay determined by the resonant circuit through which the corresponding selected portion of the modulated carrier signal was translated.

14. A variable delay system for varying the time delay of an input signal in accordance with a control signal, the system comprising: circuit means for encoding the input signal as modulation of a carrier signal; circuit means responsive to the control signal for determining the instantaneous frequency of the carrier signal; a plurality of resonant circuits individually resonant at different possible carrier frequencies for selectively translating portions of said modulated carrier signal in accordance with the instantaneous carrier frequencies thereof; a delay network having a plurality of spaced terminals individually coupled to the resonant circuits for imparting to the selected portions of the modulated carrier signal a time delay determined by the resonant circuit through which the selected portion was translated; and an output circuit for combining the delayed portions of the modulation signal to produce an output signal.

15. A variable delay system for varying the time delay of an input signal in accordance with a control signal, the system comprising: circuit means for encoding the input signal as modulation of a carrier signal; circuit means responsive to the control signal for determining the instantaneous frequency of the carrier signal; a plurality of resonant circuits individually resonant at different possible carrier frequencies for selectively translating portions of said modulated carrier signal in accordance with the instantaneous carrier frequencies thereof; a plurality of detector circuit means individually coupled to said resonant circuits for detecting the modulation of the carrier-signal portion translated thereby; a delay network having a plurality of spaced terminals individually coupled to the detectors for imparting to the detected portions of the modulation signal a time delay determined by the resonant circuit through which the corresponding selected portion of the modulated carrier signal was translated; and an output circuit for combining the delayed portions of the modulation signal to produce an output signal.

References Cited in the file of this patent

UNITED STATES PATENTS

| | | |
|---|---|---|
| 2,230,212 | Crosby | Jan. 28, 1941 |
| 2,350,869 | Bliss | June 6, 1944 |
| 2,441,957 | De Rosa | May 25, 1948 |
| 2,713,677 | Scott et al. | July 19, 1955 |